United States Patent
Gray et al.

(10) Patent No.: US 7,054,773 B2
(45) Date of Patent: May 30, 2006

(54) DYNAMIC MODEL-BASED COMPENSATED TUNING OF A TUNABLE DEVICE

(75) Inventors: Thomas A. Gray, Santa Rosa, CA (US); Robin A. Bordow, Petaluma, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 10 days.

(21) Appl. No.: 10/449,361

(22) Filed: May 30, 2003

(65) Prior Publication Data
US 2004/0243330 A1 Dec. 2, 2004

(51) Int. Cl.
*G01R 23/16* (2006.01)
*H03L 7/00* (2006.01)

(52) U.S. Cl. .............................. 702/76; 702/75; 331/16

(58) Field of Classification Search ................. 702/76, 702/75, 106; 331/4, 16, 17, 25
See application file for complete search history.

(56) References Cited

U.S. PATENT DOCUMENTS

| 3,715,620 | A | * | 2/1973 | Marro | 315/364 |
| 5,130,670 | A | * | 7/1992 | Jaffe | 331/2 |
| 6,186,955 | B1 | * | 2/2001 | Baura | 600/526 |
| 2002/0005111 | A1 | * | 1/2002 | Ludwig | 84/645 |

OTHER PUBLICATIONS

Jaroslaw Uher and Wolfgang J. R. Hoefer, "Tunable Microwave and Millimeter-Wave Band-Pass Filters," IEEE Trans. Microwave Theory Tech., vol. MTT.39, No. 4, pp. 643-652, 1991.

J. Douglas Adam, Lionel E. Davis, Gerald F. Dione, Ernst F. Schloemann, and Steven N. Stitzer, "Ferrite Devices and Materials," IEEE Trans. Microwave Theory Tech., vol. MTT.50, No. 3, pp. 721-737, 2002.

* cited by examiner

*Primary Examiner*—John Barlow
*Assistant Examiner*—Meagan S Walling

(57) ABSTRACT

A dynamic model of non-linear tuning behavior is used to tune a tunable device. The model quantifies a difference between a tuning characteristic of an ideal device and an actual tuning characteristic of the device. The model adjusts the tuning according to the difference. A method of compensated tuning of tunable device comprises employing a dynamic model of the tunable device to produce a compensated tuning control input to the tunable device during tuning. A tuning compensator for a tunable device comprises the dynamic model that is employed with an input tuning command to generate a compensated tuning command. A tuning-compensated YTF comprises a dynamic model-based tuning compensator and a YTF. A spectrum analyzer having a tuning-compensated preselector comprises a YTF preselector, a frequency converter, a video signal processor unit, a tuning compensator, and a controller. The tuning compensator uses the dynamic model to tune the preselector.

24 Claims, 7 Drawing Sheets

DYNAMIC MODEL-BASED COMPENSATED TUNING OF A TUNABLE DEVICE

TECHNICAL FIELD

The invention relates to components used in electronic test and measurement equipment. In particular, the present invention relates to tuning a tunable device such as a yttrium-iron-garnet (YIG) preselector filter used in a frequency scanned spectrum analyzer.

BACKGROUND ART

Microwave spectrum analyzers and related frequency-scanned, superheterodyne microwave receivers typically employ a tunable yttrium-iron-garnet (YIG) bandpass filter, or YIG tuned filter (YTF), as a preselector filter. The YTF preselector filter helps to prevent or at least minimize the presence and effects of various unwanted mixing products in an output of a first frequency conversion stage of the spectrum analyzer. In general, to be effective in as a preselector, tuning of the YIG tuned filter must be synchronized to a frequency tuning or sweeping of the spectrum analyzer. In particular, a center frequency of the YIG tuned filter must track or correspond to a scan frequency of the spectrum analyzer. In addition, at an end of a frequency sweep, tuning of the YIG tuned filter must be returned to a start frequency before a next sweep can be started.

In most cases, the YIG tuned filter is tuned by applying a tuning signal, typically a linear ramp voltage or ramp current, to a tuning port or input of the filter. The linear tuning signal is often generated using a digital-to-analog converter (DAC) and is based on a known start frequency, stop frequency, and sweep time of the frequency sweep being performed. In turn, a sweep controller of the spectrum analyzer simultaneously controls a frequency of a tunable local oscillator of the first frequency conversion stage and the DAC output used to tune the YIG tuned filter. Thus, the YIG tuned filter by virtue of the application of DAC-generated tuning signal, effectively tracks a frequency sweep of the spectrum analyzer.

Unfortunately, YIG tuned filters generally have tuning responses that generally are not particularly linear. The observed non-linearity of the tuning response of a typical YIG tuned filter results in an effective tracking error between an intended and an actual tuned frequency of the YIG tuned filter. The tracking errors associated with non-linearity of the YIG tuning response adversely affect an accuracy of amplitude measurements made with the spectrum analyzer, among other things.

In addition, YIG tuned filters typically exhibit a hysteresis in the tuning response. The tuning hysteresis is manifested by a non-linear time lag between the tuning signal and the tuning response. The presence of such a tuning hysteresis generally necessitates the application of a 'de-hysteresis' pulse in the tuning signal of the YIG tuned filter during a retrace or retuning of the YIG tuned filter. The de-hysteresis pulse is applied when transitioning from a stop frequency back to a start frequency at an end of a frequency sweep. In most cases, the de-hysteresis pulse momentarily tunes the YIG tuned filter below the start frequency so that the filter tuning always approaches the start frequency from 'below' at the beginning of each sweep. By approaching the start frequency from below and in a consistent manner at the beginning of each sweep, the effect of tuning hysteresis is minimized. Unfortunately, the de-hysteresis pulse and a settling time associated therewith increase a time between successive frequency sweeps. As a result, an overall sweep repetition rate of the spectrum analyzer is effectively reduced from using the de-hysteresis pulse in YIG tuned filter tuning.

Accordingly, it would be advantageous to have an approach to tuning a tunable device, such as YIG tuned filter, that reduced, or preferably minimized, the effects of tuning non-linearity and tuning hysteresis. Such a tuning approach would solve a long-standing need in the area of tunable devices, such as YIG tuned filters, used in swept-frequency microwave spectrum analyzers and related scanning superheterodyne microwave receivers.

SUMMARY OF THE INVENTION

The present invention facilitates the tuning of a tunable device. In particular, the present invention employs a dynamic model of the non-ideal tuning behavior of the device. The dynamic model essentially quantifies a dynamic difference between an ideal tuning characteristic and an actual or real tuning characteristic of the device. The dynamic model allows a tuning command or signal applied to the device to be adjusted according to the difference. As such, the adjustment essentially anticipates or compensates for a modeled non-linearity and a modeled tuning hysteresis of the device. The resulting compensation of the tuning effectively tunes the device in a manner more representative of or consistent with an ideal tuning characteristic of the device. Tunable devices include, but are not limited to, a yttrium-iron-garnet (YIG) bandpass filter (i.e., YIG tuned filter (YTF)).

In one aspect of the invention, a method of compensated tuning of a tunable device is provided. The method comprises employing a dynamic model to produce a compensated tuning control input for the tunable device during tuning. The dynamic tuning model models one or both of a tuning non-linearity and a tuning hysteresis of the tunable device.

In another aspect of the invention, a tuning compensator for a tunable device is provided. The tuning compensator comprises a dynamic model of the tunable device. The dynamic model comprises modeled dynamic tuning non-linearity and modeled dynamic tuning hysteresis associated with tuning the tunable device. The dynamic model is employed in conjunction with an input tuning command received by the tuning compensator to generate a compensated tuning command.

In other aspects of the invention, a tuning-compensated YIG tuned filter is provided. In still other aspects of the invention, a spectrum analyzer having a tuning-compensated preselector is provided.

The present invention effectively compensates for non-linearity of a tuning response of a tunable device, thereby improving tracking with respect to an ideal tuning response. The present invention also may be employed to reduce, or preferably minimize, temperature-related effects in device tuning. Moreover, the present invention may enable faster tuning by eliminating a need for using a de-hysteresis pulse during a retrace of the tunable device. Advantageously, the present invention is not limited to compensated tuning of YTF, but may be applied to provide compensated tuning of other tunable devices that exhibit tuning non-linearities and/or tuning hysteresis. Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
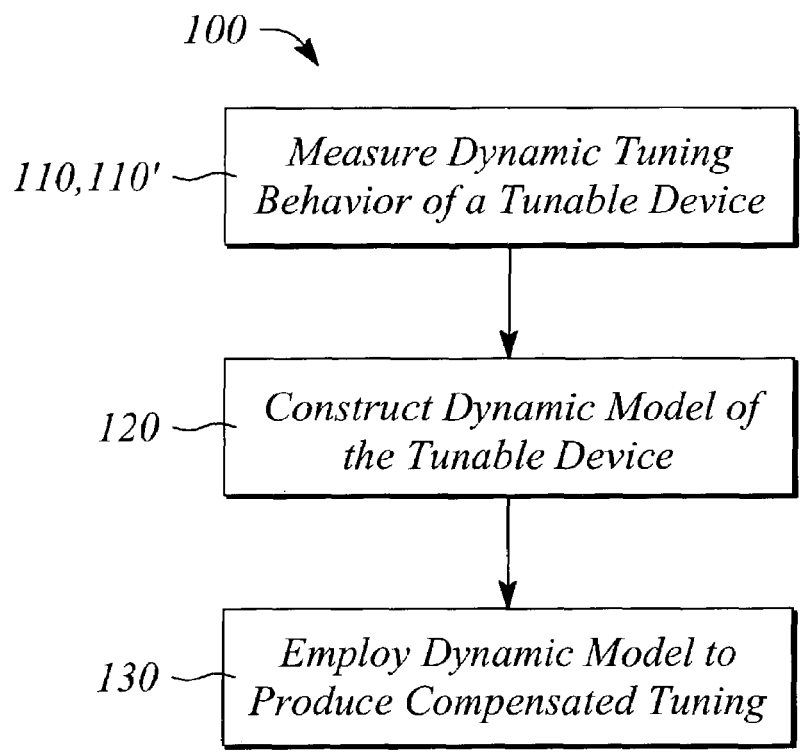
FIG. 1 illustrates a flow chart of a method of compensated tuning of a tunable device according to an embodiment of the present invention.

FIG. 1 illustrates a flow chart of a method 100 of compensated tuning of a tunable device according to an embodiment of the present invention. In particular, the method 100 of compensated tuning compensates for a non-ideal tuning behavior or characteristic of the tunable device. For example, the tunable device may be a yttrium-iron-garnet (YIG) tuned filter. The non-ideal tuning behavior may include, but is not limited to, a tuning non-linearity, a tuning hystereris, and an effect of temperature on tuning of the device. For simplicity of discussion and without loss of generality, hereinbelow a YIG tuned filter (YTF) represents the tunable device. One skilled the art may readily extend the discussion below to compensated tuning of virtually any tunable device and still be within the scope of the present invention.

As used herein, 'tuning response' refers to a response of a tunable device, such as the YTF, to a tuning input or an applied tuning signal. The tuning response of a YTF may be defined in terms of any characteristic of the YTF that is affected by tuning including, but not limited to, a center frequency or a band edge frequency of a passband of the YTF. A 'tuning error' is a deviation from or difference between an 'actual' or measured tuning response and an ideal tuning response. The term 'tuning trajectory' as used herein refers to a collection of tuning errors of the YTF tuning response as a function of a tuning input. The tuning trajectory is often representative of measured data.

In general, the tuning trajectory of a tunable device, such as the YTF, may be defined as a function $T(x)=x-y(x)$ where a variable x is the tuning input or applied tuning signal and $y(x)$ is the tuning response or tuning output of the tunable device. For an ideal tunable device, that is a device having no tuning errors, the tuning response $y(x)$ is a linear function of the tuning input x. Thus, an ideal tuning trajectory $T'(x)$ assumes a constant value for all tuning input values x (i.e., $T'(x)=A \forall x$, where A is a constant value). On the other hand, for a non-ideal tunable device, such as a real YTF, tuning errors including tuning non-linearity and tuning hysteresis result in an 'actual' tuning trajectory $T(x)$ that is a non-linear function of x.

Figure 2A:
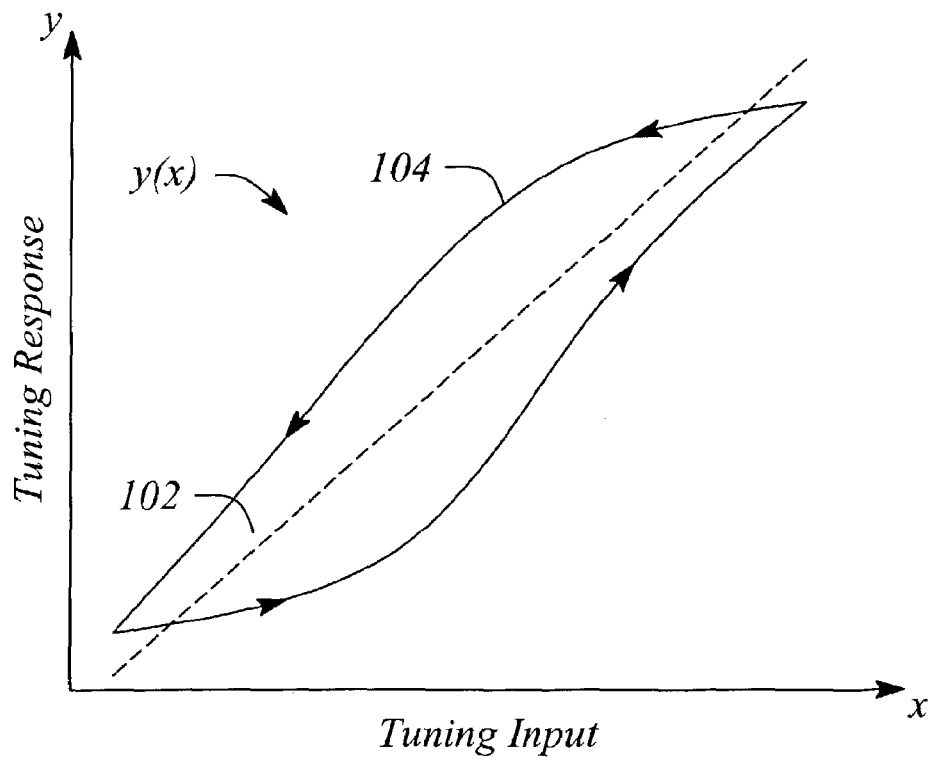
FIG. 2A illustrates an ideal tuning response and an actual tuning response of a typical YTF plotted as a function of the tuning input.
Figure 2B:
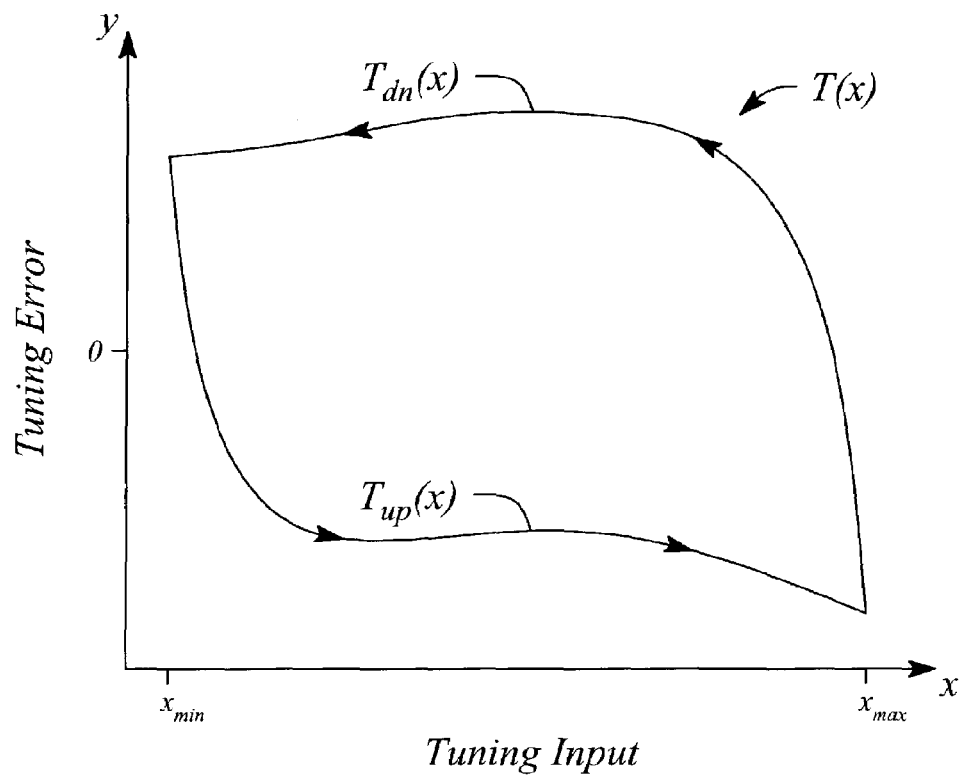
FIG. 2B illustrates a tuning trajectory associated with the actual tuning response illustrated in FIG. 2A.

FIG. 2A illustrates an ideal tuning response and an actual tuning response typical of an exemplary YTF plotted as a function of the tuning input. As illustrated in FIG. 2A, a 'dashed' line represents the ideal tuning response curve 102 of the YTF while a 'solid' line represents the actual tuning response curve 104. Arrows illustrated on the actual tuning response curve 104 indicate a tuning direction. FIG. 2B illustrates an actual tuning trajectory $T(x)$ associated with the actual tuning response illustrated in FIG. 2A. Arrows illustrated on the actual tuning trajectory $T(x)$ curve indicate a tuning direction.

As can be seen in FIGS. 2A and 2B, the actual tuning response 104 deviates from the ideal tuning response 102 thereby effectively tracing out a 'loop' as the YTF is tuned. The loop-shaped deviation represents a tuning error of the YTF. By the definition hereinabove, the tuning trajectory $T(x)$ illustrated in FIG. 2B is representative of or proportional to the tuning error of the YTF.

While including effects of both tuning non-linearity and tuning hysteresis, the loop-shaped deviation of the actual tuning response illustrated in FIG. 2A and the loop-shaped tuning trajectory $T(x)$ illustrated in FIG. 2B both may be referred to as 'hysteresis' loops. Thus, as illustrated in FIG. 2A, tuning the YTF in an upward (i.e., increasing frequency) direction results in the actual tuning response 104 that lags the ideal tuning response 102. Similarly, the actual tuning response 104 lags the ideal tuning response 102 when the YTF tuning direction is reversed and the YTF is tuned in a downward (i.e., decreasing frequency) direction. The lags produce a generally negative tuning error for the upward tuning direction and generally positive tuning error for the downward tuning direction. Thus, the tuning trajectory $T(x)$, as illustrated in FIG. 2B, may be divided into a lower portion $T_{up}(x)$ representing the negative tuning errors of the upward tuning direction and an upper portion $T_{dn}(x)$ representing the positive tuning errors of the downward tuning direction.

Referring again to FIG. 1, the method 100 of compensated tuning comprises measuring 110 a dynamic tuning behavior of the YTF. The measured 110 dynamic tuning behavior preferably includes measuring one or both of a tuning non-linearity and a tuning hysteresis of the YTF. In most practical cases, it is not possible to separately measure tuning non-linearity and tuning hysteresis of the YTF, so both are measured 110 together to produce a combined measured 110 dynamic behavior. In addition, an effect of various environmental factors including, but not limited to, temperature may be included in the measured 110 dynamic tuning behavior.

In some embodiments, measuring 110 comprises tuning the YTF and determining a tuning error associated with the actual tuning response of the YTF (i.e., determining the actual tuning trajectory). For example, the tuning error may be determined from a measured deviation, the deviation being between an actual tuned center frequency and an expected or ideal tuned center frequency. Alternatively, a deviation from another ideal characteristic of the YTF, such as an upper or lower 3-dB band edge, may be employed to measure tuning error. As used herein, measuring a tuning error and measuring a tuning trajectory are used interchangeably and are meant to be equivalent. Moreover, the measured tuning error or trajectory is generally made up of measured data, typically in the form of pairs of tuning input and tuning error data points or values.

Preferably, the tuning error is measured 110 while the YTF is being tuned to capture as much of a dynamic tuning error behavior as possible. More preferably, the tuning error is measured during tuning for a plurality of tuning cycles, each cycle of the plurality having a different tuning range or extent of the tuning input. In addition, the YTF preferably is tuned during measuring 110 in a manner that tends to maximize an extent of the tuning errors during at least one of the tuning cycles. One skilled in the art, without undue experimentation, may readily determine an appropriate tuning rate of the YTF that is simultaneously slow enough and fast enough to maximize the tuning error extent. The determined tuning rate may be employed during one of the tuning cycles. Preferably, the determined tuning rate is employed during a tuning cycle in which the YTF is tuned from a minimum frequency to a maximum frequency and back to the minimum frequency. One skilled in the art is familiar with various methods of dynamically measuring 110 the tuning error of a YTF that yield a measured tuning error, all of which are within the scope of the present invention.

Thus, for example, measuring 110 a tuning error may comprise measuring the tuning error for a major hysteresis loop and measuring the tuning error associated with one or more minor hysteresis loops. As used herein, a minor hysteresis loop is also referred to as a 'sub loop'. Measuring the major hysteresis loop tuning error comprises tuning the YTF from a relatively lowest frequency to a relatively highest frequency and back to a relatively lowest frequency while measuring the tuning error as a function of tuned frequency (or tuning input value). A lowest frequency is a tuned frequency at a low frequency end of a tuning range of the YTF, while a highest frequency is a tuned frequency at a high frequency end of the tuning range relative to the low frequency end. The tuning range of the YTF may be either a tuning range or capability of the YTF itself, or a tuning subrange defined by an intended use of the YTF. Thus, a YTF having a 3 GHz to 50 GHz tuning range may have a lowest frequency of 3 GHz and a highest frequency of 50 GHz or may have a lowest frequency that is greater than 3 GHz (e.g., 8 GHz) and a highest frequency of less than 50 GHz (e.g., 40 GHz). One skilled in the art may readily choose the lowest and the highest frequency for characterizing the major hysteresis loop for a given situation without undue experimentation.

Measuring a tuning error for one or more minor hysteresis loops comprises defining a tuning range for the sub loop, tuning the YTF over the defined tuning range, and measuring the tuning error as a function of tuned frequency (or tuning input) during the tuning. Preferably, the tuning error is measured for a set of sub loops essentially spanning the major hysteresis loop.

For example, the set of several minor hysteresis loops spanning the major hysteresis loop may be defined by shifting up a lowest frequency of tuning and shifting down a highest frequency of tuning by intervals of approximately 5 GHz in the case of a YTF having a tuning range of 3 GHz to 50 GHz. Thus, a first minor hysteresis loop of the set may be measured for a YTF tuning from 8 GHz to 45 GHz, a second minor hysteresis loop of the set may be measured for a YTF tuning from 13 GHz to 40 GHz, and so on. Preferably, the minor hysteresis loops lie inside the major loop, thereby yielding additional information regarding the tuning behavior of the YTF beyond that provided by the major hysteresis loop. As used herein, the term 'minor hysteresis loop' and sub loop are used interchangeably. One skilled in the art can readily determine a spacing of the minor hysteresis loop measurements without undue experimentation.

The result of measuring 110 dynamic tuning behavior is a measured tuning trajectory $T(x)$ for the major hysteresis loop and a set of measured minor or sub loop trajectories $T_{sub}(x)$. Each trajectory $T(x)$, $T_{sub}(x)$ is represented by a set of measured data (pairs of input x and response y) corresponding to the trajectory $T(x)$, $T_{sub}(x)$.

The method 100 of compensated tuning further comprises constructing 120 a dynamic tuning model using the measured 110 behavior as represented by the trajectories $T(x)$, $T_{sub}(x)$. Various methods may be used to construct 120 the dynamic tuning model including, but not limited to, an application of Preisach's Theory or an extension thereof. Preferably, when Preisach's Theory is employed, an asymmetry of the data representing the measured hysteresis loops (e.g., major and minor hysteresis loops) is removed prior to fitting a polynomial to the measured data. In many cases, observed asymmetry is largely associated with a tuning non-linearity of the YTF. As such, data asymmetry removal may be referred to as data linearization or a removal or separation of non-linearity from the data representing the measured major hysteresis loop. One skilled in the art is familiar with a number of methods for removing such asymmetry.

Following removal of data asymmetry or data linearization, the major hysteresis loop may be modeled with a symmetrical polynomial. For example, a $4^{th}$ order symmetrical polynomial may be employed. The symmetrical polynomial may be used in conjunction with Preisach's Theory to develop a closed-form equation that predicts a trajectory of the YTF tuning based on a current tuning location and a past tuning history for the YTF. As such, the developed closed-form equation provides a dynamic model of the measured 110 YTF tuning behavior. An article by S. E. Naidu entitled "Simulation of the Hysteresis Phenomenon using Preisach's Theory," *IEEE Proceedings*, Vol. 137, Pt. A, No. 2, March 1990, pp. 73–79, incorporated herein by reference, may be consulted for additional specific information on Preisach's Theory and the use thereof to model hysteresis loops.

Figure 3:
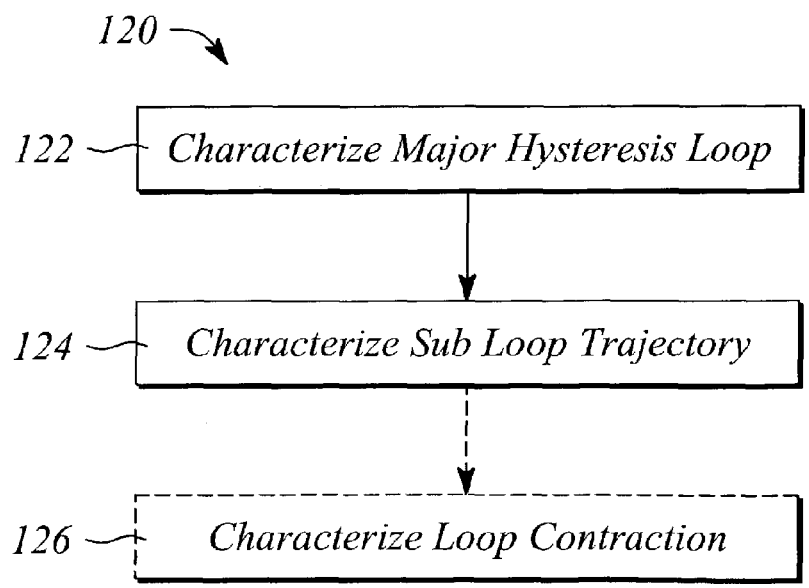
FIG. 3 illustrates a flow chart of an exemplary embodiment of constructing a model of a YTF from measurements of the YTF according to the present invention.

FIG. 3 illustrates a flow chart of an exemplary embodiment of constructing 120 a dynamic model of a YTF from measurements of the YTF according to the present invention. Constructing 120 comprises characterizing 122 a major hysteresis loop. In general, the major hysteresis loop may be characterized 122 in terms of the tuning response, the tuning trajectory, or any of a variety of equivalent means for characterizing.

Figure 4A:
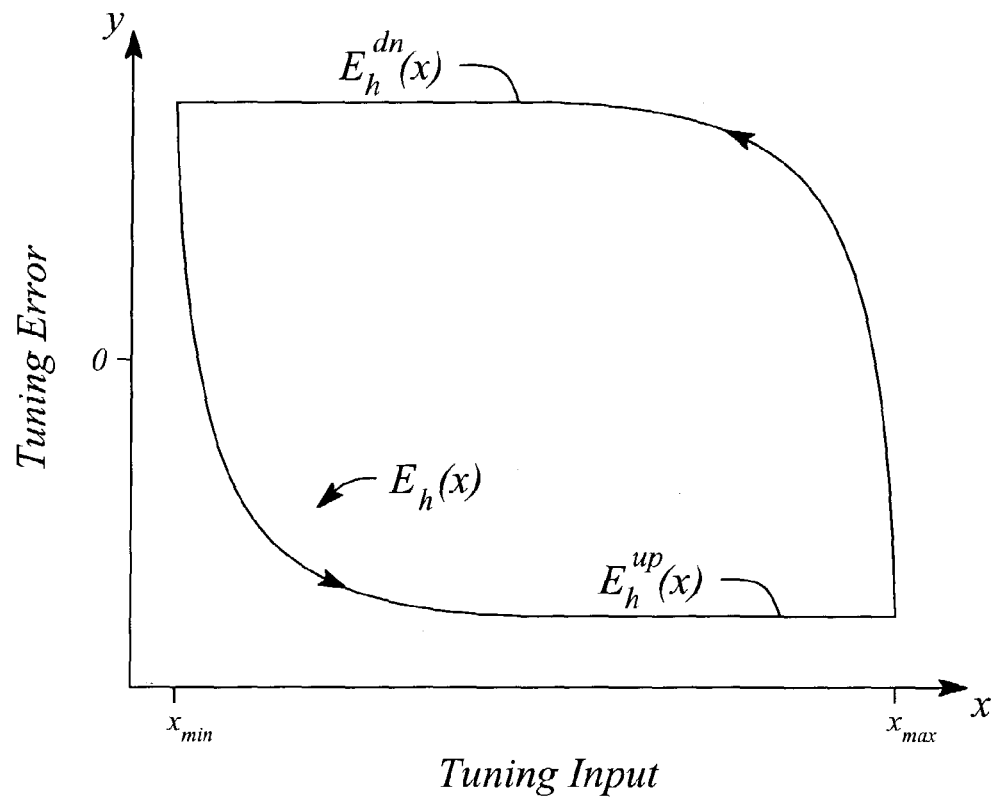
FIG. 4A illustrates a plot of a major loop hysteresis error representing an exemplary tuning trajectory from which a tuning non-linearity has been separated according to the present invention.

In some embodiments, characterizing 122 a major hysteresis loop comprises separating a tuning non-linearity from the tuning trajectory $T(x)$ of the major hysteresis loop. Separating the tuning non-linearity produces a 'linearized' tuning trajectory T(x). Herein, the linearized tuning trajectory is referred to as a major hysteresis error $E_h(x)$ for the major hysteresis loop. Advantageously, an upper half and a lower half of the major loop hysteresis error $E_h(x)$ are approximately congruent. FIG. 4A illustrates a plot of the major loop hysteresis error $E_h(x)$ for an exemplary tuning trajectory T(x).

Further in some embodiments, the determined hysteresis error $E_h(x)$ may be fit to a function allowing for a closed form equation to represent any value of the determined hysteresis error $E_h(x)$ within the major hysteresis loop. As a result of characterizing 122, a portion of the dynamic model that models the major hysteresis loop is constructed. As noted hereinabove, the portion modeling the major hysteresis loop may be in the form of a fitted, closed form equation. Alternatively, the portion modeled may be in the form of data, interpolation of which models the major hysteresis loop.

Empirical results for a number of YTFs have revealed that most, if not all, of the effects of tuning non-linearity in an upward direction tuning trajectory $T_{up}(x)$ are confined to a second portion of the tuning trajectory $T_{up}(x)$ extending from a mid point in a tuning range to the upper end of the tuning range. Similarly, the effects of tuning non-linearity in a downward direction tuning trajectory $T_{dn}(x)$ is generally confined to a second portion of the tuning trajectory $T_{dn}(x)$ extending from the mid point to the lower end of the tuning range. Thus, during characterizing 122 the major hysteresis loop, separation of the non-linearity may be accomplished by first determining a hysteresis offset $H_{offset}$ given by equation (1)

$$H_{offset} = \frac{T_{dn}(x_{mid}) - T_{up}(x_{mid})}{2} \quad (1)$$

where $x_{mid}$ is a tuning input mid point in the tuning range, and the tuning range extends from a minimum tuning input $x_{min}$ to a maximum tuning input $x_{max}$. For example, the tuning input mid point $x_{mid}$ may be determined using equation (2)

$$x_{mid} = \frac{x_{max} - x_{min}}{2} \quad (2)$$

Then, a linearity error $E_l(x)$ associated with tuning non-linearity may be determined using equation (3)

$$E_l(x) = \begin{cases} T_{dn}(x) - H_{offset} & x \leq x_{mid} \\ T_{up}(x) + H_{offset} & x > x_{mid} \end{cases} \quad (3)$$

The linearity error $E_l(x)$ given by equation (3) represents the non-linearity being separated from the tuning trajectories $T_{up}(x)$, $T_{dn}(x)$. Next, an upward hysteresis error $E_h^{up}(x)$ and a downward hysteresis error $E_h^{dn}(x)$ representing the result of separating the non-linearity from the upward trajectory $T_{up}(x)$ and the downward trajectory $T_{dn}(x)$, respectively, may be computed using equations (4A) and (4B)

$$E_h^{up}(x) = T_{up}(x) - E_l(x) \quad (4A)$$

$$E_h^{dn}(x) = T_{dn}(x) - E_l(x) \quad (4B)$$

Of course, since the upward hysteresis error $E_h^{up}(x)$ and a downward hysteresis error $E_h^{dn}(x)$ are nominally congruent, as noted hereinabove, the simplified hysteresis error $E_h(x) = E_h^{up}(x)$ may be defined. The downward hysteresis $E_h^{dn}(x)$ may be computed from the hysteresis error $E_h(x)$ using equation (5)

$$E_h^{dn}(x) = -E_h(x_{min} + x_{max} - x) \quad (5)$$

The data representing the hysteresis error $E_h(x)$ may be stored and employed as a look-up table. Interpolation may be used to compute values between entries in the look-up table. While a look-up table and interpolation may be used, preferably a closed form equation is developed that represents the hysteresis error $E_h(x)$ obviating a need for the look-up table. A closed form equation may be developed by fitting a function to the data representing the hysteresis error $E_h(x)$. For example, a function of the form given by equation (6) may be fit to the data.

$$E_h(x) = ae^{bx} + c \quad (6)$$

The coefficients a, b, and c are determined during fitting. Fitting a function, such as that given by equation (6), to determine coefficients is familiar to one skilled in the art. Once determined, the coefficients may be employed in equation (6) to compute values of the hysteresis error $E_h(x)$ for any tuning input x between $x_{min}$ and $x_{max}$. Thus, as a result of characterizing 122, the hysteresis error $E_h(x)$ may be represented by a closed form equation (e.g., equation (6) and coefficients a, b, c determined by fitting) for the purposes of constructing 120 the dynamic model, in some embodiments.

Constructing 120 the dynamic model further comprises characterizing 124 a sub loop trajectory $T_{sub}(x)$. Preferably, a plurality of sub loop trajectories $T_{sub}(x)$ are characterized 124, wherein the sub loops correspond to the sub loops that were measured 110. The characterization 124 of the sub loop trajectory $T_{sub}(x)$ essentially refines a the dynamic model being constructed 120 by adding an effect on tuning error associated with sub loops within the major hysteresis loop. Thus, the dynamic model may explicitly account for tuning errors associated with both the characterized 122 major hysteresis loop and the characterized 124 minor hysteresis loops.

Figure 4B:
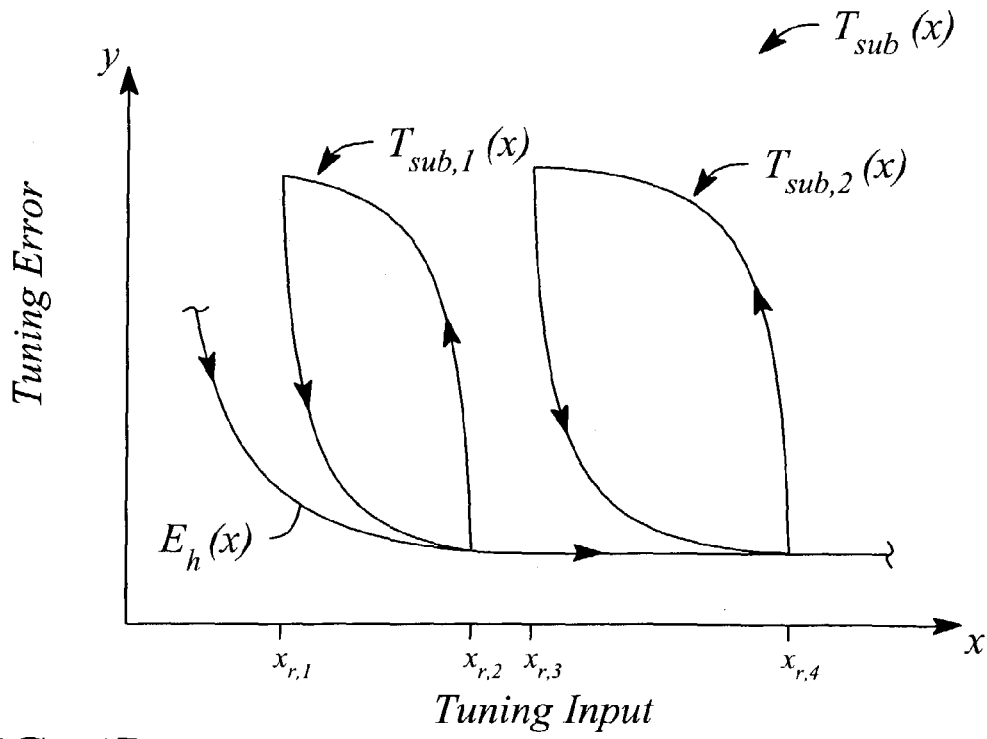
FIG. 4B illustrates an example of a pair of sub loop trajectories with reversal points associated with each of the sub loop trajectories.

In general, a minor hysteresis loop or sub loop is formed during tuning any time a tuning direction is changed or reversed at other than the maximum input $x_{max}$ or the minimum input $x_{min}$. Changing or reversing tuning direction is referred to herein as a reversal point. Thus, a sub loop trajectory $T_{sub}(x)$ may be defined in terms of a pair of reversal points $x_r$ (e.g., $x_{r,1}$ and $x_{r,2}$, where $x_{r,1} < x_{r,2}$). FIG. 4B illustrates an example of a pair of sub loop trajectories $T_{sub}(x)$ with reversal points $x_r$ associated with each of the sub loop trajectories $T_{sub}(x)$. In particular, as illustrated in FIG. 4B, a first sub loop trajectory $T_{sub,1}(x)$ is defined by a first pair of reversal points ($x_{r,1}$, $x_{r,2}$). Similarly, a second sub loop trajectory $T_{sub,2}(x)$ illustrated in FIG. 4B is defined by a second pair of reversal points ($x_{r,3}$, $x_{r,4}$). Arrows on the trajectories illustrated in FIG. 4B indicate a tuning direction.

A sub loop is said to 'open' when a first reversal point (e.g., $x_{r,2}$ or $x_{r,4}$) is reached during tuning. As the tuning continues, a second reversal point (e.g., $x_{r,1}$ or $x_{r,3}$) is reached and the sub loop trajectory $T_{sub}(x)$ begins to appear as an actual loop. Ultimately, the tuning once again reaches and may continue beyond the first reversal point. When the first reversal point is reached a second time, the sub loop is said to be 'closed'.

In principle, for a device or system that exhibits tuning hysteresis, a tuning error at some future point in time is a function of a tuning history of the device or system. Thus, to correct for a future tuning error, it is necessary to keep a complete record of all past tuning of the device or system. Fortunately, according to Preisach's theory, a property of a device or system that exhibits hysteresis, such as the YTF, is that a 'closed' sub loop has essentially no effect on a future tuning error associated with the hysteresis. Thus, once a sub loop is closed, the tuning trajectory T(x) will continue as if the sub loop never occurred. As such, Preisach's theory allows for a much more economical view of a tuning history that is needed to predict and correct for future hysteresis-based error. In essence, only a reversal point $x_r$ of a most recently opened sub loop is needed to determine a current trajectory T(x) and an associated hysteresis-based future error. These principles may be employed to further construct 120 the dynamic model by characterizing 124 sub loop trajectories $T_{sub}(x)$.

Given the congruence of hysteresis loops already noted hereinabove, an effect of a sub loop on tuning error may be described in terms of three variables: a reversal point $x_r$, a tuning error $x_r^e$ that is present at the reversal point $x_r$, an a displacement $x_{offset}$ from the reversal point $x_r$. Moreover, the sub loop trajectories will have a shape that is similar to the major loop trajectory T(x). Thus, the measured data for the sub loop trajectories $T_{sub}(x)$ may be expressed in a form that is relative to the major loop trajectory T(x), thereby reducing an order of a 3-dimensional curve fit.

In some embodiments, such a relative expression of the data may be accomplished by establishing a reference trajectory error $E_{ref}(x)$ that offsets a shape of the major loop trajectory T(x) by the displacement $x_{offset}$ and by 'zeroing out' a starting tuning error for the major loop. Thus, equation (7) may be employed to compute the reference trajectory error $E_{ref}(x)$.

$$E_{ref}(x_{offset}) = E_h(x_{min} + x_{offset}) - E_h(x_{min}) \quad (7)$$

The computed reference trajectory $E_{ref}(x)$ may be used to compute the hysteresis error of any sub loop using equation (8)

$$E_{sub}(x_r, x_r^e, x_{offset}) = x_r^e + E_{ref}(x_{offset}) + \text{subloop}(x_r, x_r^e, x_{offset}) \quad (8)$$

where a function subloop(·) represents the measured sub loop hysteresis error data offset by the tuning error $x_r^e$. Although including the effects of the tuning error $x_r^e$ at each reversal point represents an extension of Preisach's Theory, empirical data for a wide variety of tunable devices indicate that such an extension is warranted and generally preferred in most cases. In particular, including tuning error effects at each reversal point tends to improve an overall accuracy of the model constructed 120 for the YTF.

The function subloop(·) may be determined by fitting the measured sub loop data to a polynomial function in $x_r$, $x_r^e$, $x_{offset}$. In some embodiments, the constructed 120 dynamic tuning model may be simplified by ignoring the dependence on the tuning error $x_r^e$. A further simplification of the constructed 120 dynamic model may be realized in some cases by ignoring the dependence of the hysteresis error on the reversal points $x_r$. Of course ignoring the dependence on reversal points $x_r$ amounts to ignoring the measured sub loops. However, in some cases that are readily evident to one skilled in the art without undue experimentation, ignoring the measured sub loops and, by extension, omitting characterizing 124 the sub loops may be justified to simplify the constructed 120 dynamic tuning model.

Constructing 120 the dynamic model optionally further comprises characterizing 126 a contraction of a loop width of the tuning trajectory T(x) for the major hysteresis loop as function of tuning rate. It is known that a loop width of the major loop tuning trajectory T(x) contracts or is reduced as a tuning rate is increased. To characterize 126 the loop width contraction, the tuning error of the major loop is measured 110' at several different tuning rates. Preferably, the tuning error is measured 110' while the tuning input x is static (e.g., momentarily fixed) to avoid confusing eddy current-induced delay error with hysteresis error. For example, sweeping the tuning input from measurement point to measurement point will preserve the hysteresis effect while allowing eddy currents to dissipate.

The loop-width contraction is characterized 126 relative to the relatively slow tuning rate of measuring 110. The loop width may be arbitrarily defined as a value of $E_h(x)$ at $x=x_{max}$. Therefore, the measured 110' hysteresis contraction $E_c(r)$ data may be scaled relative to the slow tuning rate using equation (9)

$$E_c(r) = \frac{E_h(x_{max}, r)}{E_h(x_{max}, r_{slow})} \quad (9)$$

where r is the tuning rate and $r_{slow}$ is the slow tuning rate. The scaled hysteresis contraction $E_c(r)$ subsequently may be fit to a suitable closed form equation. One skilled in the art may readily select a suitable closed form equation for fitting without undue experimentation.

An effect of a change in tuning rate r is not instantaneous but lags the change. To account for the lag, an effective tuning rate r' may be used instead of the tuning rate r. An exponential function of the tuning input x may be used to model the effective tuning rate r'. In particular, the effective tuning rate r' may be described by equation (10)

$$r' = k \cdot \int (r - r') \cdot |dx| \quad (10)$$

With the definition of effective tuning rate r' as given by equation (10), a modified hysteresis contraction $E_c(r')$ produces a modification of the model for hysteresis error as given by equation (11)

$$E_h(x_r, x_r^e, x_{offset}, r') = E_{sub}(x_r, x_r^e, x_{offset}) \cdot E_c(r') \quad (11)$$

Referring again to FIG. 1, the method 100 of compensated tuning further comprises employing 130 the dynamic model to produce a corrected or compensated tuning control input to the YTF during tuning. In particular, the method 100 of compensated tuning employs 130 the dynamic model to compute an error between an ideal or desired tuning behavior and an actual or real tuning behavior of the YTF. With the computed error, a compensated tuning command is determined that tunes the YTF in a manner that more closely approximates the ideal tuning behavior. In essence, the dynamic model allows a tuning behavior of the YTF in response to a given input tuning command to be evaluated and corrected through the creation of the compensated tuning command.

In general, the constructed 120 dynamic model may be employed 130 in a number of different ways depending on an implementation of the method 100. For example, if all of the parameters of a frequency sweep are known in advance (e.g., a sweep of a spectrum analyzer), then the model may be used to compute entries in a table of compensated tuning commands. The computed entries may represent a set of compensated tuning commands corresponding to a set of desired tuning commands determined from the frequency sweep parameters, for example. The compensated tuning command table entries are then accessed in succession to tune the YTF. In another example, the dynamic tuning model is employed 130 to compute an offset or error correction for each new tuning command. The error correction is then added to the tuning command to produce the compensated tuning command. In yet another example, the dynamic tuning model is employed 130 in a feedback control loop to generate compensated tuning commands.

While a specific form and implementation of the constructed 120 dynamic model depends on how the model is employed, there are several general considerations regarding the use of the model. Generally, it is preferable to initialize a material of the YTF (e.g., a magnetic material). The material may be initialized by sweeping the YTF back and forth several times between a lowest and a highest frequency (e.g., change the tuning input from $x_{min}$ to $x_{max}$ and back to $x_{min}$ several times). An initial sweep rate of $r_{init}$ should be used when sweeping. The initial sweep rate $r_{init}$ used depends on the particular device application and may be readily chosen by one skilled in the art without undue experimentation. The effective tuning rate r' may be set equal to the initial sweep rate $r_{init}$.

A reversal history list may be created and employed within the model implementation to track or record occurrences of reversals that define sub loops. When employing such a reversal history list, the reversal history list preferably is initialized to contain a single reversal point $x_{min}$. In addition, a record may be made in the history list of an error at the reversal point $x_{min}$. For example, the error at $x_{min}$ is $E_h(x_{min})$. As the YTF is tuned up from $x_{min}$, the hysteresis error is given by equation (11), where $x_r$ and $x_r^e$ are simply the last values in the history list. The effective tuning rate r' is updated in discrete time by computing the integral given by equation (10) above.

At a reversal during tuning, a new reversal point $x_r$ and sub loop hysteresis error $E_{sub}(x_r)$ are added to the history list. Note that at such a reversal, the new trajectory follows a downward trajectory. Thus, a transformation of the variables used in computing the hysteresis error $E_{sub}(x)$ should be applied accordingly. While following a present downward trajectory $T_{sub}(x)$, the hysteresis error $E_{sub}(x)$ is given by equation (12)

$$E_{sub}(x_r, x_r^e, x_{offset}, r') = E_{sub}(x_{min} + x_{max} - x_r, -x_r^e, x_{offset})$$
$$\cdot E_c(r') \tag{11}$$

At a next reversal point, the reversal will be from the downward trajectory to an upward trajectory. A new entry is made in the history list corresponding to the current reversal point $x_r$ and the current sub loop hysteresis error $E_{sub}(x_r)$.

From this point and from here on, it is possible to either encounter another reversal point $x_r$ or have a sub loop closing. When a sub loop closing occurs, two entries in the history list corresponding to the sub loop are deleted. For a new reversal point $x_r$, the process outlined above is repeated. In addition, preferably $E_{sub}(\cdot)$ is bounded by $E_h(\cdot)$ to minimize accumulation of numerical error and fitting error.

Figure 5:
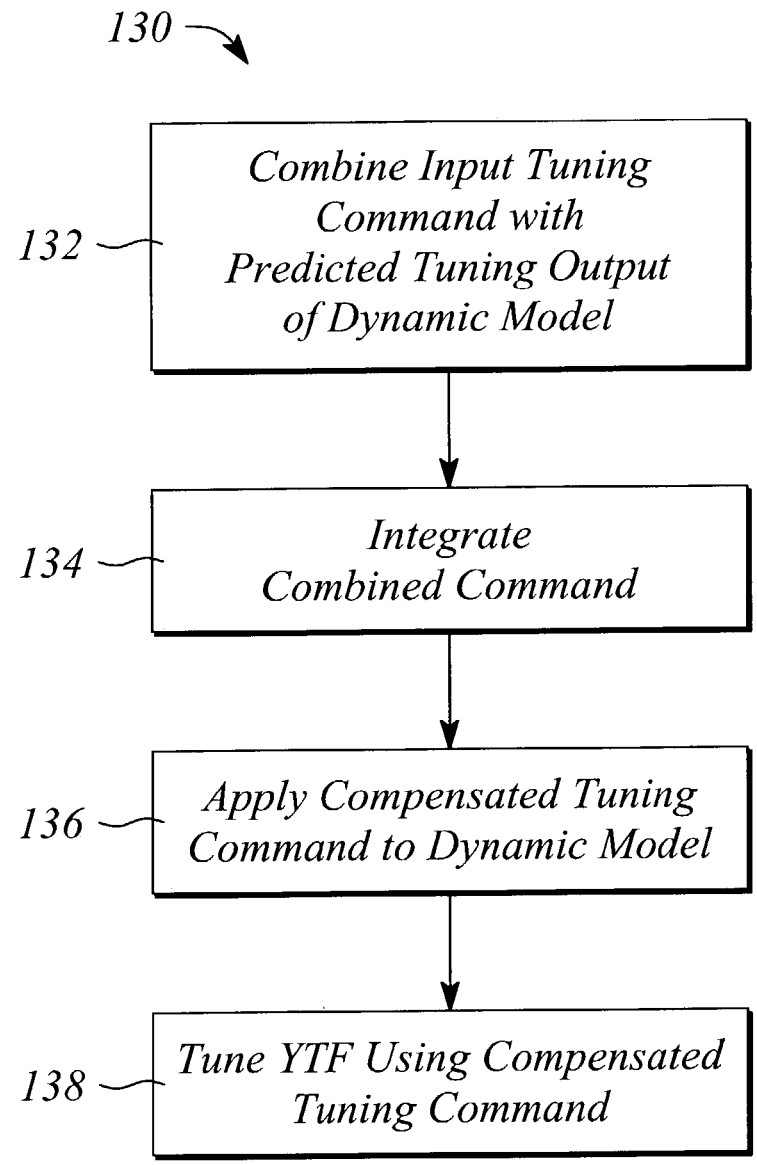
FIG. 5 illustrates a flow chart of an embodiment of employing the dynamic model in a feedback control loop according to the present invention.

FIG. 5 illustrates a flow chart of an embodiment of employing 130 the dynamic model in a feedback control loop according to the present invention. As illustrated in FIG. 5, employing 130 the dynamic model comprises combining 132 an input tuning command with a predicted tuning output of the dynamic model to create a combined command. For example, combining 132 may comprise computing a difference between the input tuning command and the predicted tuning output, such that the combined command is the computed difference.

As used herein, the input tuning command is a tuning command that normally is applied to the YTF in the absence of the present invention. Further, the 'predicted' tuning output from the dynamic model is a tuning result or output of the dynamic model that represents an estimation or prediction of a tuned condition or behavior of the modeled YTF in response to a given input to the model.

Moreover as used herein, the term 'tuning command' may refer to one or both of a digital tuning command or an analog tuning signal. Furthermore, the digital tuning command may be implemented as a parallel format, a serial format or a combination thereof and still be within the scope of the present invention. In general, to simplify implementation, the predicted tuning output of the dynamic model is understood to be in a form (i.e., digital or analog) that matches or is comparable to the input tuning command. One skilled in the art may readily concoct numerous implementations that involve any number of permutations of digital and analog forms and formats for the input tuning command and predicted tuning output. All such implementations and permutations are within the scope of the present invention.

Employing 130 further comprises integrating 134 the combined command to produce a compensated tuning command. As used herein, 'integrating' means to sum a current input command or signal with a previous command or signal. In some embodiments, the summation may involve more than one previous command or signal. As such, integration 134 preferably is analogous to conventional analog integration known in the art. However, since the command herein may be either a digital command or an analog signal, integration 134 is similarly either digital integration or analog integration, respectively, according to the nature of the command. As such, a current combined command produced by combining 132 is summed through integration 134 with one or more previous combined 132 commands to produce the compensated tuning command.

Employing 130 further comprises applying 136 the compensated tuning command to the dynamic model. When applied 136, the dynamic model produces a new predicted tuning output from the compensated tuning command. Once the new predicted tuning output is produced, combining 132 and integrating 134 are repeated. Moreover, combining 132, integrating 134, and applying 136 are repeated in this manner until a 'final' compensated tuning command or signal is realized.

In general and advantageously, combining 132, integrating 134, and applying 136 act collectively to reduce, preferably minimize, and more preferably essentially eliminate, a difference between the predicted tuning output of the dynamic model and the input tuning command. When the difference is sufficiently small, the final compensated tuning command is effectively realized. One skilled in the art may readily determine a definition for 'sufficiently small' for a given application of the present invention without undue experimentation. However, any decrease in a difference between the input tuning command and the predicted tuning output generally improves a tuning of the YTF. Therefore, a definition of 'final' may be essentially arbitrary in many practical situations and applications.

Thus, the compensated tuning command is formed as an integrated difference between the predicted tuned output and the input tuning command. At successive time points, the current difference is reduced until the compensated tuning command produces a predicted tuned output of the model that essentially equals the input tuning command. At this point, the input tuning command is compensated for tuning errors embodied in the dynamic tuning model.

Employing 130 may further comprise tuning 138 the YTF using the compensated tuning command. Moreover, the YTF may be tuned 138 simultaneously with applying 136. Alternatively, tuning 138 may occur after a final compensated tuning command or signal is realized. The compensated tuning command is essentially a command that accounts for the tuning non-linearity and hysteresis inherent in the YTF, at least to the extent that these characteristics are embodied by the dynamic model. Therefore, the compensated tuning command, when used to tune 138 the YTF, results in a tuning behavior that more closely approximates an ideal or desired tuning behavior than would have resulted if the uncompensated tuning command had been applied.

Furthermore, once the dynamic tuning behavior of the YTF has been measured 110 and the dynamic model constructed 120, the model may be employed 130 many times without repeating measuring 110 or constructing 120. In most cases, the only time measuring 110 and constructing 120 need be repeated is when a change occurs in the YTF. Moreover as mentioned above, additional sources of tuning behavior errors may be included in or incorporated into measuring 110, constructing 120, and employing 130 and still be within the scope of the present invention. For example, if effects of a temperature change on YTF tuning behavior is measured 110 and incorporated in the constructed 120 dynamic model, when the model is employed 130, the YTF is also compensated for tuning errors associated with the change in temperature.

Figure 6:
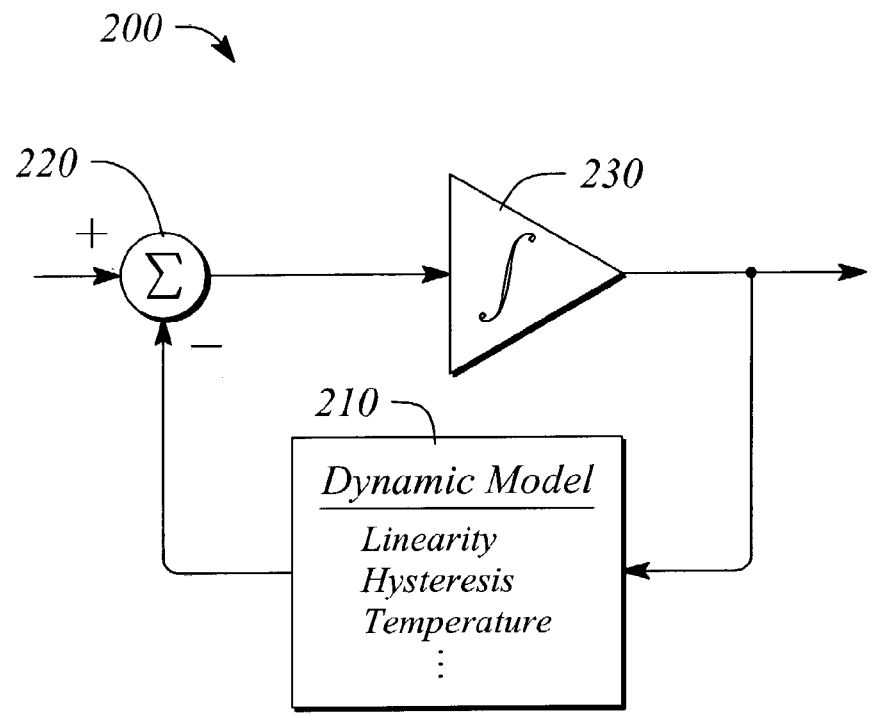
FIG. 6 illustrates a block diagram of a tuning compensator according to an embodiment of the present invention.

FIG. 6 illustrates a block diagram of a tuning compensator 200 according to an embodiment of the present invention. In particular, the tuning compensator 200 is based on and comprises a dynamic model that models a device being tuned. The tuning compensator 200 receives a tuning command and generates a compensated tuning command. The compensated tuning command when applied to a tunable device, such as a YIG tuned filter (YTF), produces compensated tuning thereof. Specifically, when applied to a YTF, the compensated tuning essentially corrects for tuning non-linearity and tuning hysteresis associated with the YTF.

For purposes of discussion, the tuning compensator 200 is described hereinbelow in terms of compensating the tuning of the YTF. However, the tuning compensator 200 of the present invention also may be applied with similar effect to other tunable devices having tuning errors associated with non-ideal tuning characteristics of the subject device. One skilled in the art, given the discussion hereinbelow, may readily extend the tuning compensator 200 to any of a number of non-YTF applications or uses and still be within the scope of the present invention.

The tuning compensator 200 comprises a dynamic model 210 of the YTF. The dynamic model 210 of the YTF is developed from measurements of the YTF. In particular, the measurements of the YTF are taken while the YTF is tuned. As such, the measurements embody dynamic error characteristics of the YTF. A variety of methods may be used to produce the dynamic model 210 from the measurements including, but not limited to, those described hereinabove with respect to the method 100 of compensated tuning.

In general, any dynamic model that represents or approximates an actual tuning behavior and/or an actual tuning error characteristic of the YTF may be employed as the dynamic model 210 according to the present invention. In particular, even the dynamic model 210 that is developed without relying on measurements of the YTF is within the scope of the present invention. For example, the dynamic model 210 based on a physical understanding or representation of the YTF may be employed.

The tuning compensator 200 further comprises a summer 220 and an integrator 230. An output of the summer 220 is connected to an input of the integrator 230 while an output of the integrator 230 is connected to an input of the dynamic model 210. A first input of the summer 220 is connected to an input of the tuning compensator 200 while a second input of the summer 220 is connected to an output of the dynamic model 210. The output of the integrator 230 is also connected to an output of the tuning compensator 200.

While generally described herein in terms of a digital implementation for the purposes of discussion herein, the tuning compensator 200 may be realized in an analogous analog implementation or a mixed analog and digital implementation and still be within the scope of the present invention. In particular and depending on a specific implementation, any of the dynamic model 210, summer 220, and integrator 230, may be realized in either a digital or an analog form for the purposes of the present invention.

The summer 220 receives a tuning command from the input of the tuning compensator 200 and computes or produces a difference between the received tuning command and a predicted tuning output from the dynamic model 210. The summer 220 may be any device or combination of devices that can compute or produce the difference. For example, the summer 220 may be an analog comparator when the tuning command and predicted tuning output are analog signals. Alternatively, the summer 220 may be implemented using logic gates as a digital subtraction circuit in a situation where the tuning command and predicted tuning output are digital signals. In yet other implementations, the summer 220 may be implemented as a 'virtual summer' in the form of computer commands executed within a microprocessor or digital signal processor (DSP). One skilled in the art may readily devise additional implementations of the summer 220, all of which are within the scope of the present invention.

The computed difference is communicated to the integrator 230 through the connection between the summer 220 output and the integrator 230 input. Within the integrator 230 the computed difference is integrated. As with the summer 220, the integrator may be implemented as an analog integrator, a digital integrator, or a virtual integrator consisting of computer commands executed by a microprocessor or DSP. The integrator 230 integrates a current computed difference with one or more previous computed differences or a previous output of the integrator 230 representative of an integration of one or more previous computed differences. The integrator 230 produces an integrated output. The integrated output is alternatively referred to herein as a compensated tuning command. The integrated output is applied to the input of the dynamic model 210 by way of the connection between the integrator 230 and the dynamic model 210.

The integrated output or compensated tuning command is also communicated to an output of the tuning compensator 200 and therethrough to a tuning input of the YIG tuned filter (YTF). The tuning compensator 200 by employing the dynamic model essentially acts to reduce, preferably to minimize, and more preferably, to essentially eliminate, the computed difference such that the integrated output is optimized. The optimized output, in turn, causes the YTF to tune in a manner that closely approximates a behavior of an ideal YTF having no hysteresis and no tuning non-linearties.

Figure 7:
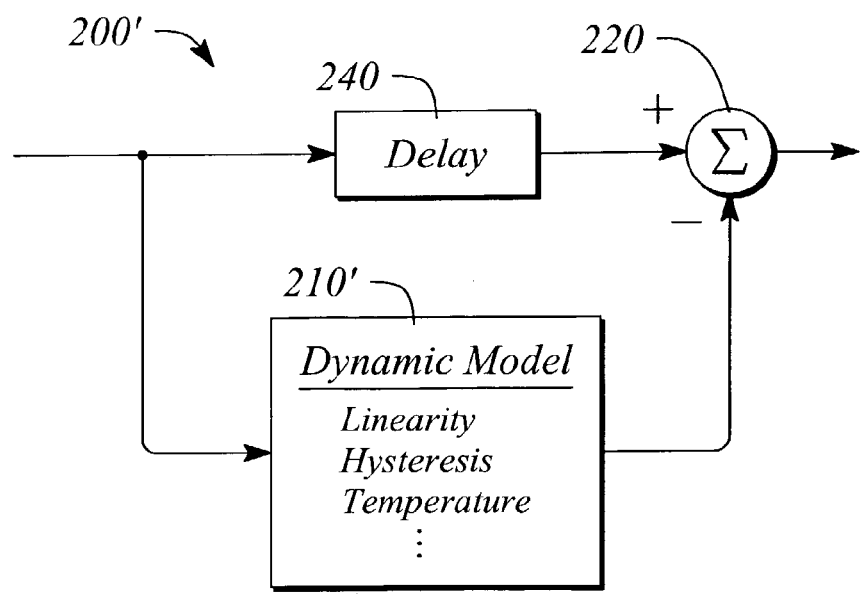
FIG. 7 illustrates a block diagram of another embodiment of a tuning compensator according to the present invention.

FIG. 7 illustrates a block diagram of another embodiment of a tuning compensator 200' according to the present invention. The tuning compensator 200' may be termed a 'feed-forward' compensator in contrast to the feedback nature of the tuning compensator 200. The tuning compensator 200' comprises a dynamic model 210', the summer 220, and a delay element 240. An input of the tuning compensator 200' is connected to an input of the dynamic model 210' and an input to the delay element 240. An output of the delay element 240 and an output of the dynamic model 210' are connected to inputs of the summer 220. An output of the summer 220 is connected to an output of the tuning compensator 200'.

The dynamic model 210' is essentially similar to the dynamic model 210 described hereinabove with respect to the tuning compensator 200. The dynamic model 210' differs from the dynamic model 210 in that the dynamic model 210' outputs a 'tuning error' in response to an input tuning command while the dynamic model 210 produces a predicted tuning output. The tuning error output by the dynamic model 210' represents an estimation of an actual tuning error of the YTF. The delay element 240 delays an applied tuning input or command by an amount of time approximately equal to a delay time of the dynamic model 210'.

A tuning command received from the input of the tuning compensator 200' is replicated and applied both to the input of the dynamic model 210' and to the input of the delay element 240. The dynamic model 210' computes a tuning error from the tuning command. The delay element 240 delays the tuning command. The tuning error is combined with the delayed tuning command by the summer 220 to produce a compensated tuning command. For example, the tuning error and tuning command may be combined by the summer 220 by subtracting the tuning error from the tuning command. The compensated tuning command is communicated to an output of the tuning compensator 200' and therethrough to a tuning input of the YIG tuned filter (YTF).

Figure 8:
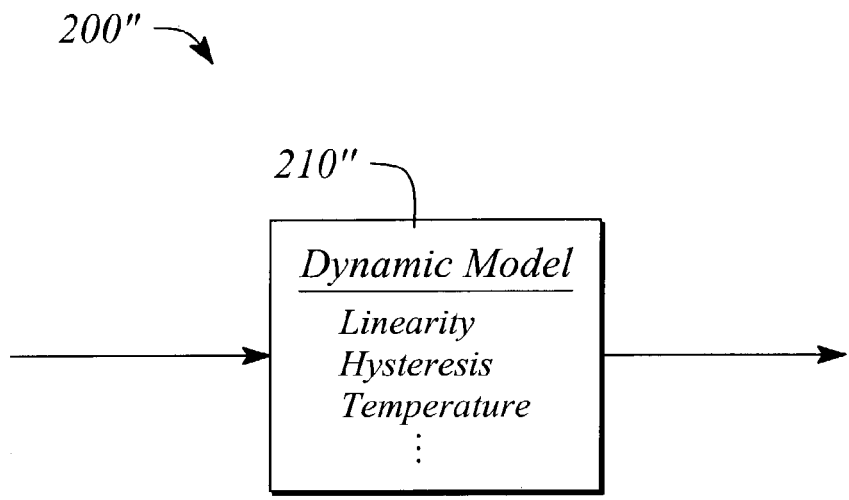
FIG. 8 illustrates a block diagram of another embodiment of a tuning compensator according to the present invention.

FIG. 8 illustrates a block diagram of another embodiment of a tuning compensator 200" according to the present invention. The tuning compensator 200" comprises a dynamic model 210" that receives a tuning command from an input of the tuning compensator 200" and computes a compensated tuning command from the received tuning command. The dynamic model 210" may be termed a mapping function that maps a tuning command to a compensated tuning command. For example, if a set of parameters describing a tuning session are known a priori in advance, the dynamic model 210" may produce a set of compensated tuning commands for the tuning session. The compensated tuning commands may be stored in the form of a look-up table, for example. When a tuning session is performed, the compensated tuning commands are accessed from the look-up table and applied to the YTF. A spectrum analyzer that is programmed to perform a repetitive sweep from a first frequency to a second frequency at a given sweep rate exemplifies a situation when a set of parameters describing a tuning session are generally known a priori in advance.

Figure 9:
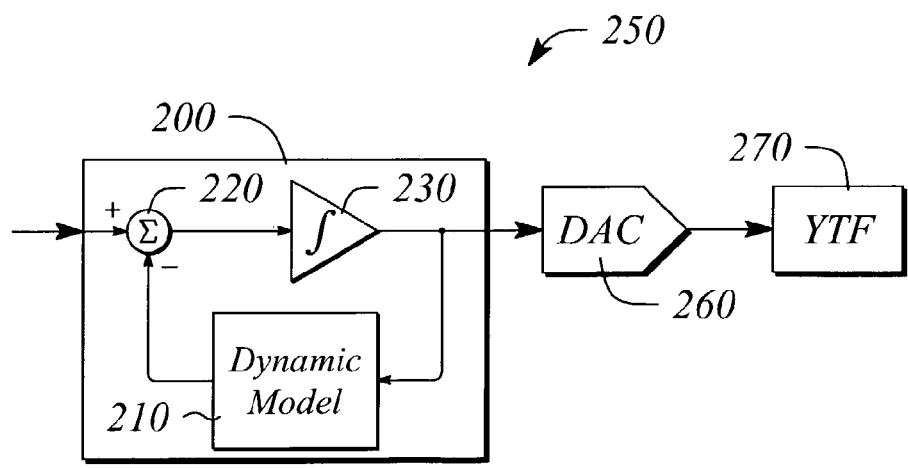
FIG. 9 illustrates a block diagram of an embodiment of a tuning-compensated YIG tuned filter (TC-YTF) that employs a tuning compensator according to the present invention.

FIG. 9 illustrates a block diagram of an embodiment of a tuning-compensated YIG tuned filter (TC-YTF) 250 that employs the tuning compensator 200 according to the present invention. The TC-YTF 250 comprises the tuning compensator 200, a digital to analog converter (DAC) 260, and a YIG tuned filter (YTF) 270. As illustrated in FIG. 9, the output of the tuning compensator 200 is connected to an input of the DAC 260. The DAC 260 converts a digital compensated tuning command produced by the tuning compensator 200 into an analog YIG control signal. The analog YIG control signal is applied to a control input of the YTF 270. It should be noted that the tuning compensator of the TC-YTF 250 can be any one of the tuning compensators 200, 200', 200" described above in accordance with the present invention.

Figure 10:
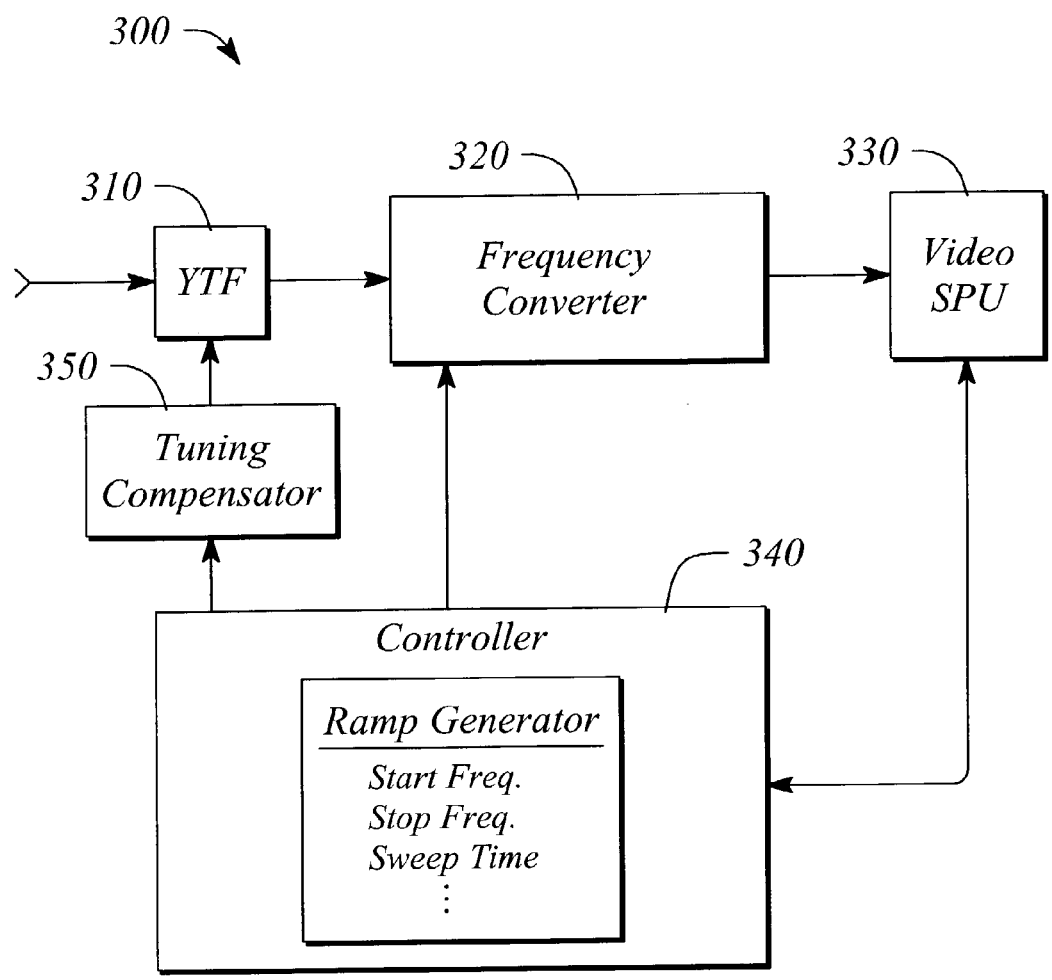
FIG. 10 illustrates a simplified block diagram of a spectrum analyzer having a tuning-compensated YIG tuned filter (YTF) preselector according to an embodiment of the present invention.

FIG. 10 illustrates a simplified block diagram of a spectrum analyzer 300 having a tuning-compensated YIG tuned filter (YTF) preselector according to an embodiment of the present invention. The simplified block diagram illustrated in FIG. 10 includes only those major elements of a typical spectrum analyzer 300 necessary to understand the present invention. One skilled in the art may readily extend the discussion hereinbelow with respect to the simplified block diagram illustrated in FIG. 10 to virtually any practical spectrum analyzer that employs a YTF preselector and still be within the scope of the present invention.

The spectrum analyzer 300 comprises a YIG tuned filter (YTF) preselector 310, a frequency converter 320, a video signal processor unit (SPU) 330, a controller 340, and a tuning compensator 350. A radio frequency (RF) input of the YTF preselector 310 is connected to an input port of the spectrum analyzer 300. An output of the YTF preselector 310 is connected to an RF input of the frequency converter 320 while an output of the frequency converter 320 is connected to an input of the video SPU 330. The controller 340 is connected to a control input of the frequency converter 320 and a control input/output of the video SPU 330. In addition, the controller 340 is connected to an input of the tuning compensator 350, an output of which is connected to a control input of the YTF preselector 310.

The controller 340 generates tuning commands for the YTF preselector 310 and the frequency converter 320. For example, if the spectrum analyzer 300 is to perform a frequency sweep, the controller 340 generates a sequence of tuning commands that are communicated through the appropriate connections to the YTF preselector 310, the frequency converter 320, and the video SPU 330. A typical sweep is defined by a start frequency, a stop frequency, and a sweep time. The sequence of tuning commands typically comprises a sequence of tuning steps starting at the start frequency and progressing to the stop frequency. The sequence is followed by a command that returns the YTF preselector 310 and the frequency converter 320 to the start frequency to prepare the spectrum analyzer 300 for a next sweep. Timing and frequency spacing of the tuning steps of the sequence are determined by the sweep time, among other factors.

As described hereinabove, the tuning compensator 350 compensates or corrects the tuning commands generated by the controller 340 for tuning non-linearities and hysteresis associated with the YTF preselector 310. The tuning compensator 350 comprises a dynamic model of the YTF preselector 310, the dynamic model embodying a dynamic tuning behavior of the YTF preselector 310. In a preferred embodiment, the tuning compensator 350 is essentially the tuning compensator 200 described hereinabove. Alternatively, any of the other tuning compensators 200' or 200" described above may be used. In particular, the dynamic model of the tuning compensator 350 is preferably constructed from a measured tuning performance of the YTF preselector 310. Moreover, the tuning compensator 350 preferably employs the dynamic model in a feedback loop that employs an integrator. The action of the feedback loop reduces and preferably attempts to minimize or even eliminate, a tuning error at each tuning step of a sweep. The tuning error is a difference between a desired tuning of a tuning command generated by the controller 340 and a predicted tuning produced by the dynamic model.

While illustrated in FIG. 10 as a separate element within the spectrum analyzer 300, the tuning compensator 350 may be a portion of the controller 340. In particular, the tuning compensator 350 may be implemented as a portion of a computer program that is executed by the controller 340. For example, the computer program may comprise commands that implement the functionality of the tuning compensator 350. Thus, the commands may implement the dynamic model, a summer and an integrator, as described hereinabove with respect to the tuning compensator 200. In another example, the controller 340 may comprise a digital signal processor (DSP) front end and a main processor/controller. The main processor/controller provides control of the overall operation of the spectrum analyzer 300. The DSP front end executes a tuning control program that controls the tuning of the spectrum analyzer 300. In such an embodiment, the tuning compensator 350 may be implemented as a portion of the tuning control program.

Thus, there have been described various embodiments of the present invention that facilitate compensated tuning of a tunable device, such as a YIG tuned filter. In particular, a method of model-based compensated tuning and a tuning compensator have been described. In addition, a spectrum analyzer having a tuning-compensated YTF preselector has been described. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. A method of compensated tuning of a tunable device comprising:
   employing a dynamic tuning model to produce a compensated tuning control input to the tunable device during tuning, wherein the dynamic model models one or both of a tuning non-linearity and a tuning hysteresis of the tunable device, and
   measuring a dynamic tuning behavior of the tunable device, measuring comprising tuning the tunable device and measuring a tuning error of the tunable device, wherein the tuning error is a deviation from an expected or ideal characteristic of the tunable device.

2. The method of claim 1 wherein the tunable device is a yttrium-iron-garnet (YIG) timed filter.

3. The method of claim 1, further comprising:
   constructing the dynamic tuning model using the measured behavior.

4. The method of claim 1, wherein measuring a dynamic tuning behavior further comprises measuring a major hysteresis loop and one or more relatively minor hysteresis loops for the tunable device.

5. The method of claim 1, wherein the employed dynamic tuning model is constructed comprising:
   characterizing a major hysteresis loop of the tunable device to account for a non-linearity tuning error;
   characterizing a sub loop trajectory of the major hysteresis loop to account for a sub loop tuning error; and
   optionally characterizing a loop width contraction of a tuning trajectory for the major hysteresis loop as a function of a tuning rate.

6. The method of claim 1, wherein employing a dynamic tuning model comprises:
   combining an input tuning command with a predicted tuning output of the dynamic model to create a combined command;
   integrating the combined command to produce a compensated tuning command; and
   applying the compensated tuning command to the dynamic model.

7. The method of claim 6, wherein combining the input tuning command with the predicted tuning output comprises computing a difference between the input tuning command and the predicted tuning output.

8. The method of claim 7, wherein combining, integrating and applying reduces the computed difference, and wherein combining, integrating and applying are optionally repeated until the computed difference is minimized.

9. The method of claim 6, further comprising tuning the tunable device using the compensated tuning command.

10. A tuning compensator for a tunable device comprising:
    a dynamic model of the tunable device, the dynamic model comprising modeled dynamic tuning non-linearity and modeled dynamic tuning hysteresis associated with tuning the tunable device, wherein the dynamic model is employed in conjunction with an input tuning command received by the tuning compensator to generate a compensated tuning command,
    wherein the tunable device is a yttrium-iron-garnet (YIG) tuned filter.

11. The tuning compensator of claim 10, wherein the dynamic model is developed from measurements of the tunable device, and wherein the compensated tuning command corrects for the tuning non-linearity and the tuning hysteresis associated with the tunable device.

12. The tuning compensator of claim 10, further comprising:
    a summer having a first input connected to an input of the tuning compensator and a second input connected to an output of the dynamic model; and
    an integrator having an integrator input connected to an output of the summer and an integrator output connected to an input of the dynamic model and to an output of the tuning compensator,
    wherein the summer computes a difference between the input tuning command and a predicted tuning output of the dynamic model, and wherein the integrator produces the compensated tuning command.

13. The tuning compensator of claim 12, wherein the summer receives the input tuning command from the tuning compensator input and the predicted tuning output from the dynamic model output.

14. The tuning compensator of claim 12, wherein the integrator receives the computed difference from the summer output, the integrator integrating the computed difference to produce the compensated tuning command at the dynamic model input and at the tuning compensator output.

15. The tuning compensator of claim 10, further comprising:
    a summer having a first input connected to an output of the dynamic model and a summer output connected to an output of the tuning compensator; and
    a delay having a delay input that along with an input of the dynamic model are connected to an input of the tuning compensator and a delay output connected to a second input of the summer,
    wherein the summer computes a difference between the input tuning command received from the delay and a tuning error received from the dynamic model that is responsive to the input tuning command, and wherein the summer produces the compensated tuning command from the computed difference.

16. The tuning compensator of claim 10, further comprising:
a set of compensated tuning commands corresponding to set of received tuning commands for a tuning session, each of the compensated tuning commands being computed by the dynamic model using a set of a priori known parameters describing the tuning session.

17. A tuning-compensated yttrium-iron-garnet (YIG) tuned filter comprising:
a tuning compensator comprising a dynamic model of a tuning behavior of the YIG tuned filter; and
a YIG tuned filter, the filter being tuned by a compensated tuning command from an output of the tuning compensator.

18. The tuning-compensated YIG tuned filter of claim 17, wherein the tuning compensator further comprises:
a summer that computes a difference between an input tuning command to the tuning compensator and a predicted tuning output from the dynamic model, the computed difference being used to produce the compensated tuning command; and either
an integrator connected between an output of the summer and an output of the tuning compensator, an output of the integrator being further connected to an input of the dynamic model, the integrator producing the compensated tuning command from the computed difference, or
a delay connected between an input of the tuning compensator and a first input of the summer, the dynamic model being connected between the tuning compensator input and a second input of the summer, the computed difference being the compensated tuning command.

19. The timing-compensated YIG tuned filter of claim 17, wherein the tuning compensator further comprises:
a computer program executed by a computer, the computer program comprising instructions that employ the dynamic model of tuning behavior of the YIG tuned filter to compute the compensated tuning command from an input tuning command such that a difference between a predicted tuning output of the dynamic model and the input tuning command is reduced.

20. A spectrum analyzer having a tuning-compensated preselector comprising:
a yttrium-iron-garnet (YIG) tuned filter preselector having a first input connected to an input of the spectrum analyzer;
a frequency converter having a first converter input connected to an output of the preselector;
a video signal processor unit having an input connected to an output of the frequency converter;
a controller having a first output connected to a second input of the frequency converter, the video signal processor unit being connected to the controller; and
a tuning compensator connected between the controller and the preselector, the tuning compensator comprising a dynamic model of a tuning behavior of the preselector.

21. The spectrum analyzer of claim 20, wherein a second output of the controller is connected to an input of the tuning compensator, an output of the tuning compensator being connected to a second input of the preselector.

22. The spectrum analyzer of claim 21, wherein the tuning compensator further comprises:
a summer having a first input connected to an input of the tuning compensator and a second input connected to an output of the dynamic model; and
an integrator having an integrator input connected to an output of the summer and an integrator output connected to an input of the dynamic model,
wherein the summer computes a difference between an input tuning command and a predicted tuning output of the dynamic model, and wherein the integrator produces a compensated tuning command.

23. The spectrum analyzer of claim 20, wherein the controller comprises the tuning compensator, the tuning compensator being a portion of a computer program that is executed by the controller, the tuning compensator program portion comprising instructions that, when executed by the controller, employ the dynamic model of the preselector to compute a compensated tuning command from an input tuning command, the compensated tuning command tuning the preselector.

24. The spectrum analyzer of claim 20, wherein the controller comprises:
a digital signal processor; and
a main processor, the main processor providing control of an overall operation of the spectrum analyzer, the digital signal processor executing a tuning control program that controls tuning of the spectrum analyzer,
wherein the tuning compensator is a portion of the tuning control program, the tuning compensator portion of the tuning control program comprising instructions that, when executed by the digital signal processor, employ the dynamic model of the preselector to compute a compensated tuning command from an input tuning command, the compensated tuning command timing the preselector.

* * * * *

UNITED STATES PATENT AND TRADEMARK OFFICE
CERTIFICATE OF CORRECTION

PATENT NO. : 7,054,773 B2  Page 1 of 1
APPLICATION NO. : 10/449361
DATED : May 30, 2006
INVENTOR(S) : Gray et al.

It is certified that error appears in the above-identified patent and that said Letters Patent is hereby corrected as shown below:

In column 17, line 48, in Claim 2, delete "timed" and insert -- tuned --, therefor.

In column 19, line 37, in Claim 19 delete "timing-compensated" and insert -- tuning-compensated --, therefor.

In column 20, line 49, in Claim 24, delete "timing" and insert -- tuning --, therefor.

Signed and Sealed this

Nineteenth Day of September, 2006

JON W. DUDAS
*Director of the United States Patent and Trademark Office*